(12) United States Patent
Liu et al.

(10) Patent No.: US 10,930,815 B2
(45) Date of Patent: Feb. 23, 2021

(54) LIGHT EMITTING DEVICE

(71) Applicant: XIAMEN SAN'AN OPTOELECTRONICS CO., LTD., Xiamen (CN)

(72) Inventors: Chao Liu, Tianjin (CN); Zhendong Ning, Tianjin (CN); Ling-Fei Wang, Tianjin (CN); Jun-Zhao Zhang, Tianjin (CN); Weihuan Li, Tianjin (CN); Wen-Hao Gao, Tianjin (CN); Chaoyu Wu, Xiamen (CN); Duxiang Wang, Tianjin (CN)

(73) Assignee: Xiamen San'an Optoelectronics Co., Ltd., Fujian (CN)

( * ) Notice: Subject to any disclaimer, the term of this patent is extended or adjusted under 35 U.S.C. 154(b) by 0 days.

(21) Appl. No.: 16/672,826

(22) Filed: Nov. 4, 2019

(65) Prior Publication Data

US 2020/0066934 A1   Feb. 27, 2020

Related U.S. Application Data

(63) Continuation-in-part of application No. PCT/CN2018/081677, filed on Apr. 3, 2018.

(30) Foreign Application Priority Data

Aug. 1, 2017  (CN) .......................... 2017 1 0647048

(51) Int. Cl.
| | | |
|---|---|---|
| *H01L 33/10* | (2010.01) | |
| *H01L 33/30* | (2010.01) | |
| *H01L 33/46* | (2010.01) | |
| *H01L 33/06* | (2010.01) | |

(52) U.S. Cl.
CPC .............. *H01L 33/10* (2013.01); *H01L 33/06* (2013.01); *H01L 33/30* (2013.01); *H01L 33/46* (2013.01)

(58) Field of Classification Search
CPC ......... H01L 33/10; H01L 33/30; H01L 33/06; H01L 33/46
See application file for complete search history.

(56) References Cited

U.S. PATENT DOCUMENTS

2011/0164308 A1* 7/2011 Arsenault ........... G02F 1/15165
359/322
2014/0319571 A1* 10/2014 Hakuta ................... H01L 33/46
257/98

FOREIGN PATENT DOCUMENTS

CN            104112800 A     10/2014

\* cited by examiner

*Primary Examiner* — Savitri Mulpuri
(74) *Attorney, Agent, or Firm* — Rosenberg, Klein & Lee (57) ABSTRACT

A light emitting device includes a light emitting structure and a distributed Bragg reflector (DBR) structure disposed thereon. The light emitting structure includes an n-type confinement layer, an active layer disposed on the n-type confinement layer, and a p-type confinement layer disposed on the active layer opposite to the n-type confinement layer. The n-type and p-type confinement layers are disposed proximal and distal to the DBR structure, respectively. The DBR structure includes first to $N^{th}$ DBR units. The first and $N^{th}$ DBR units are disposed proximal and distal to the light emitting structure, respectively. Each of the first to $N^{th}$ DBR units has a center reflection wavelength defined by $\lambda+(z-1)\lambda_0$.

13 Claims, 6 Drawing Sheets

FIG.6

LIGHT EMITTING DEVICE

CROSS-REFERENCE TO RELATED APPLICATION

This application is a bypass continuation-in-part application of International Application No. PCT/CN2018/081677 filed on Apr. 3, 2018, which claims priority of Chinese Patent Application No. 201710647048.5, filed on Aug. 1, 2017. The entire content of each of the international and Chinese patent applications is incorporated herein by reference.

FIELD

The disclosure relates to a light emitting device, and more particularly to a light emitting device having a distributed Bragg reflector structure.

BACKGROUND

AlGaInP materials are closely lattice-matched with GaAs substrates, and can be used to produce light emitting diodes (LEDs) having internal quantum efficiency of at least 90%. However, the LEDs made from AlGaInP materials might have unsatisfactorily low light extraction efficiency (of about 20% to 30%) due to the internal total reflection. Therefore, means for enhancing light extraction efficiency have been developed. Examples of such means include growth of a distributed Bragg reflector (DBR) structure, film coating, roughening, design of configuration, and so forth.

Among the possible means for enhancing light extraction efficiency, growth of a DBR structure is commonly applied nowadays. However, without proper design of DBR, light reflected from the bottom of the DBR structure needs to pass through multiple interfaces, and hence might be reflected again at these interfaces. Thus, such light might end up entering a surface at a large incidence angle and travel laterally, reducing the light emission efficiency.

Figure 1:
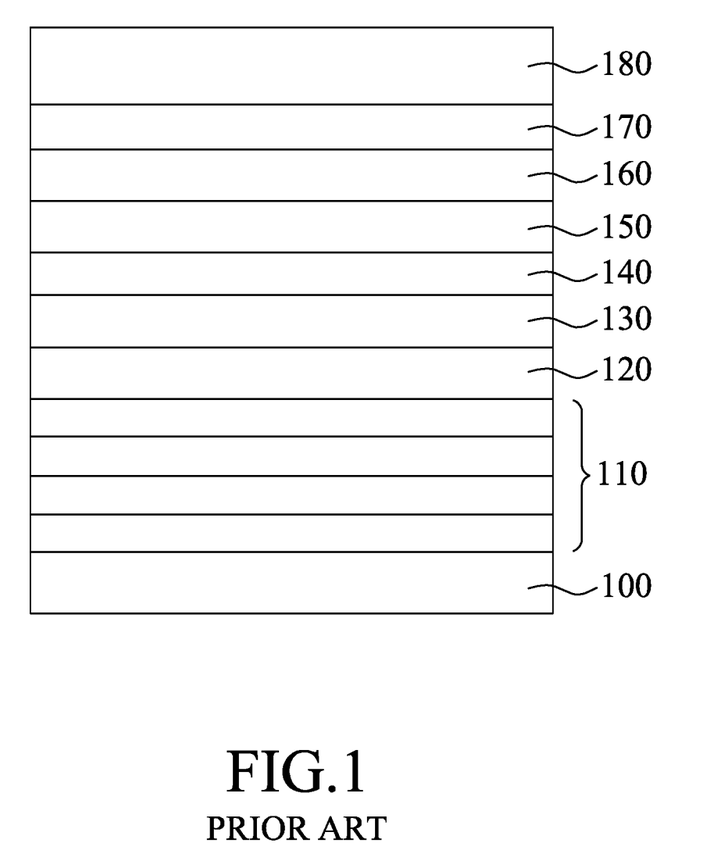
FIG. 1 is a schematic view of a conventional light emitting device.

Referring to FIG. 1, a conventional LED with an AlGaInP-based epitaxial structure includes a substrate 100 and the following components sequentially disposed on the substrate 100: a DBR structure 110, an AlInP-based n-type confinement layer 120, a AlGaInP-based first waveguide layer 130, an active layer 140, a AlGaInP-based second waveguide layer 150, a AlInP-based p-type confinement layer 160, a conversion layer 170, and a GaP-based window layer 180. A relatively large refractive index is observed among the first and second waveguide layers 130, 150 and the n-type and p-type confinement layers 120, 160, as well as between the p-type confinement layer 160 and the window layer 180. Light emission from the active layer 140 may be light emission from a combination of point light sources. Light incidence occurs at various angles in the conventional LED, and numerous incident light entering the interfaces of the conventional LED at a large angle travels laterally and hence is guided to exit the conventional LED laterally or to be absorbed by the conventional LED itself (to be specific, the crystal structure of the conventional LED).

SUMMARY

Therefore, an object of the disclosure is to provide a light emitting device that can alleviate at least one of the drawbacks of the prior art.

The light emitting device includes a multilayered light emitting structure and a multilayered distributed Bragg reflector (DBR) structure.

The light emitting structure includes an n-type confinement layer, an active layer that is disposed on the n-type confinement layer, and a p-type confinement layer that is disposed on the active layer opposite to the n-type confinement layer. The light emitting structure is disposed on the DBR structure, so that the n-type confinement layer and the p-type confinement layer of the light emitting structure are disposed proximal and distal to the DBR structure, respectively.

The DBR structure includes first to $N^{th}$ DBR units. N is an integer not less than two. The first to $N^{th}$ DBR units are sequentially arranged in a direction away from the light emitting structure, so that the first DBR unit and the $N^{th}$ DBR unit are disposed proximal and distal to the light emitting structure, respectively. Each of the first to $N^{th}$ DBR units has a center reflection wavelength defined by $\lambda+(z-1)\lambda_0$, where $\lambda$ represents a wavelength of light emitted from the active layer, z represents a numerical order of a corresponding one of the first to $N^{th}$ DBR units and is not less than 1 and not greater than N, $(z-1)\lambda_0$ represents a maximum blue shift of the corresponding one of the first to $N^{th}$ DBR units, and $\lambda_0$ represents a reference wavelength.

BRIEF DESCRIPTION OF THE DRAWINGS

Other features and advantages of the disclosure will become apparent in the following detailed description of the embodiment (s) with reference to the accompanying drawings, of which.

DETAILED DESCRIPTION

Before the disclosure is described in greater detail, it should be noted that where considered appropriate, reference numerals or terminal portions of reference numerals have been repeated among the figures to indicate corresponding or analogous elements, which may optionally have similar characteristics.

Figure 2:
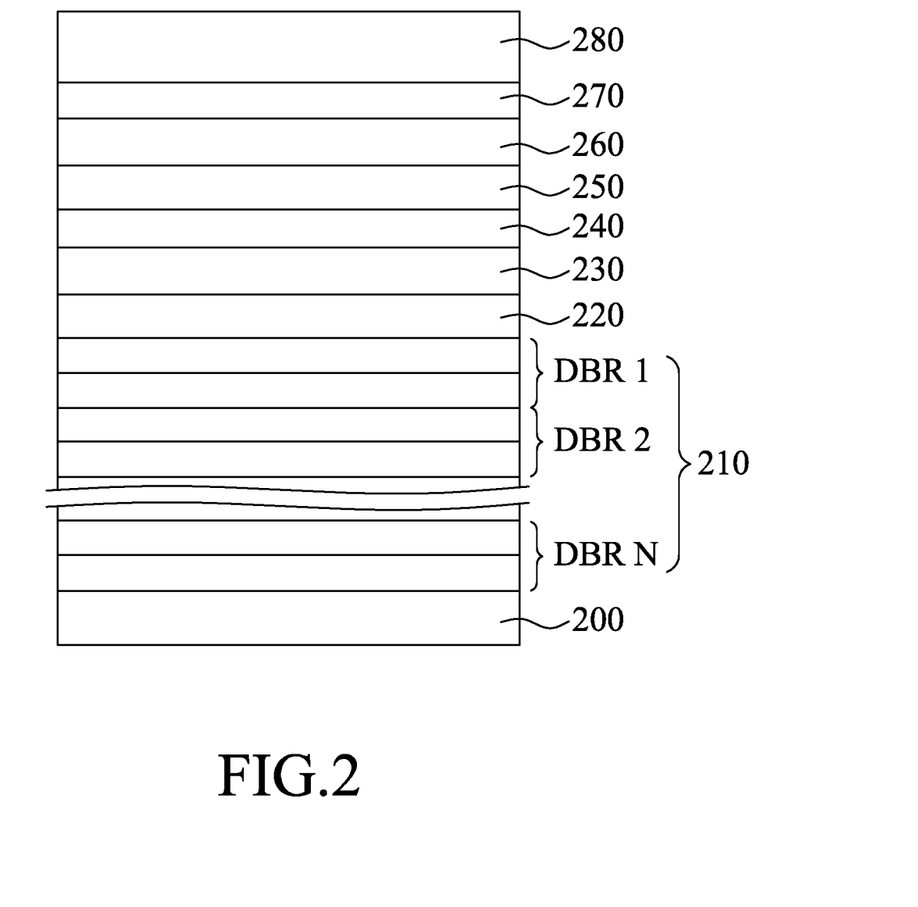
FIG. 2 is a schematic view illustrating a first embodiment of a light emitting device according to the present disclosure.

Referring to FIG. 2, a first embodiment of a light emitting device according to the present disclosure includes a substrate 200, a multilayered distributed Bragg reflector (DBR) structure 210 disposed on the substrate 200, and a multilayered light emitting structure disposed on the DBR structure 210 opposite to the substrate 200. In this embodiment, the light emitting device is a quaternary system-based light emitting device.

In this embodiment, the substrate 200 may be made from GaAs.

The light emitting structure has opposite first and second surfaces, and includes an n-type confinement layer 220 that has opposite upper and lower surfaces, an active layer 240 that is disposed on the upper surface of the n-type confinement layer 220 and has opposite top and bottom surfaces, and a p-type confinement layer 260 that is disposed on the top surface of the active layer 240 opposite to the n-type confinement layer 220. The light emitting structure may be an epitaxial structure. In this embodiment, the active layer 240 is indirectly disposed on the upper surface of the n-type confinement layer 220, and the p-type confinement layer 260 is indirectly disposed on the top surface of the active layer 240. Furthermore, in this embodiment, the first surface of the light emitting structure serves as a light emitting surface, and the lower surface of the n-type confinement layer 220 serves as the second surface of the light emitting structure.

In this embodiment, the light emitting structure further includes a first $Al_xGa_{(1-x)}InP$-based waveguide layer 230 that is disposed between the n-type confinement layer 220 and the active layer 240, a second $Al_xGa_{(1-x)}InP$-based waveguide layer 250 that is disposed between the p-type confinement layer 260 and the active layer 240, an $Al_aGa_{(1-a)}In_bP$-based graded layer 270 that is disposed on the p-type confinement layer 260 opposite to the active layer 240, and a GaP-based window layer 280 that is disposed on the $Al_aGa_{(1-a)}In_bP$-based graded layer 270 opposite to the p-type confinement layer 260.

Regarding the first and second $Al_xGa_{(1-x)}InP$-based waveguide layers 230, 250, "x" is greater than 0 and less than 1.

Regarding the $Al_aGa_{(1-a)}In_bP$-based graded layer 270, "a" represents a number greater than 0 and less than 1, "b" represents a number greater than 0 and less than 1, and the sum of "a" and "b" is equal to 1. In this embodiment, "a" is not less than 0.1 and less than 1, and "b" ranges from 0.2 to 0.5. When the intermediate composition range is enhanced, the fluctuation of refractive index and lattice constant between the p-type confinement layer 260 and the window layer 280 can be reduced.

The $Al_aGa_{(1-a)}In_bP$-based graded layer 270 has a gradient refractive index so as to reduce lateral traveling of oblique incident light and enhance light output from the light emitting surface (i.e. the first surface) of the light emitting structure.

In this embodiment, the $Al_aGa_{(1-a)}In_bP$-based graded layer 270 has a thickness ranging from 10 nm to 50 nm.

In this embodiment, the active layer 240 has a multiple quantum well structure which includes a barrier sublayer made from $Al_{a1}Ga_{(1-a1)}InP$ ($0.1 \leq a1 \leq 0.3$), and a well sublayer made from $Al_{a2}Ga_{(1-a2)}InP$ ($a1 > a2$).

The materials for the n-type confinement layer 220 and the p-type confinement layer 260 can be selected based on the band gap of the active layer 240. For the active layer 240 having light emission wavelength not less than 670 nm and hence possessing a relatively small band gap, the cladding layers (i.e. the n-type and p-type confinement layers 220, 260) on the active layer 240 may be made from AlGaAs or AlGaInP. For the active layer 240 having a light emission wavelength less than 670 nm (particularly less than 640 nm) and hence possessing a relatively large band gap (normally larger than 1.9 eV), the cladding layers on the active layer 240 should be made from a material with a large band gap, which is normally an $Al_cIn_{(1-c)}P$ material (where $0 < c \leq 0.5$).

Regarding such material, the $Al_{0.5}In_{0.5}P$ material has the largest band gap. Accordingly, in this embodiment, the n-type confinement layer 220 and the p-type confinement layer 260 are each made from the $Al_{0.5}In_{0.5}P$ material, so that the difference of the band gap between the active layer 240 and the p-type confinement layer 260 is maximized, and so that the difference of the band gap between the active layer 240 and the n-type confinement layer 220 is maximized.

The DBR structure 210 has opposite third and fourth surfaces. The light emitting structure is disposed on the third surface of the DBR structure 210, so that the n-type confinement layer 220 and the p-type confinement layer 260 of the light emitting structure are disposed proximal and distal to the third surface of the DBR structure, respectively. In other words, the second surface of the light emitting structure (i.e. the lower surface of the n-type confinement layer 220) is disposed on the third surface of the DBR structure 210.

The DBR structure 210 includes first to $N^{th}$ DBR units (designated as DBR 1 to DBR N), where the number "N" is an integer not less than two. In this embodiment, the number "N" is not less than three and may range from 3 to 5. The first to $N^{th}$ DBR units (DBR 1 to DBR N) are sequentially arranged in a direction away from the second surface of the light emitting structure (i.e. the lower surface of the n-type confinement layer 220 in this embodiment), so that the first DBR unit (DBR 1) and the $N^{th}$ DBR unit (DBR N) are disposed proximal and distal to the second surface of the light emitting structure, respectively.

The DBR structure 210 aims to reflect light emitted downwardly from the active layer 240 (including light entering vertically and obliquely) to the DBR structure 210. Since the active layer 240 may be a point light source, reflection of oblique incident light results in a blue shift, such that conventional DBR structures cannot reflect such light. The DBR structure 210 employed in the present disclosure is designed to enhance the center reflection wavelength so as to effectively reflect oblique incident light emitted from the active layer 240. To be specific, each of the first to $N^{th}$ DBR units (DBR 1 to DBR N) has a center reflection wavelength defined by $\lambda + (z-1)\lambda_0$, where "$\lambda$" represents a wavelength of light emitted from the active layer 240, "z" represents a numerical order of a corresponding one of the first to $N^{th}$ DBR units (DBR 1 to DBR N) and is not less than 1 and not greater than N, "$(z-1)\lambda_0$" represents a maximum blue shift of the corresponding one of the first to $N^{th}$ DBR units (DBR 1 to DBR N), and "$\lambda_0$" represents a reference wavelength and is greater than 0. For instance, the first DBR unit (DBR 1) has a center reflection wavelength of $\lambda$, the second DBR unit (DBR 2) has a center reflection wavelength of $\lambda + \lambda_0$, and the $N^{th}$ DBR unit (DBR N) has a center reflection wavelength of $\lambda + (N-1)\lambda_0$.

Each of the first to $N^{th}$ DBR units (DBR 1 to DBR N) has a higher refractive index layer and a lower refractive index layer that are disposed proximal and distal to the light emitting structure, respectively. $\lambda_0$ is defined by the following equation (I):

$$\lambda_0 = \frac{4\lambda\pi}{\pi^2 \sin^{-1}\left(\frac{n_h - n_l}{n_h + n_l}\right) - 4\sin\left(\frac{n_h - n_l}{n_h + n_l}\right)} \quad (I)$$

where "$n_h$" and "$n_l$" respectively represent refractive indices of the higher and lower refractive index layers of the corresponding one of the first to $N^{th}$ DBR units (DBR 1 to DBR N) at λ.

In this embodiment, the number "N" is an integer equal to or greater than 3. Specifically, N is an integer obtained by rounding off a quotient defined by the following equation (II):

$$Q = \left[\frac{(\lambda - \lambda_c)}{\lambda_0} + 1\right] \quad (II)$$

where "Q" represents the quotient and "$\lambda_c$" represents a maximum wavelength of light entering the corresponding one of the first to $N^{th}$ DBR units (DBR 1 to DBR N) and undergoing a blue shift.

Figure 3:
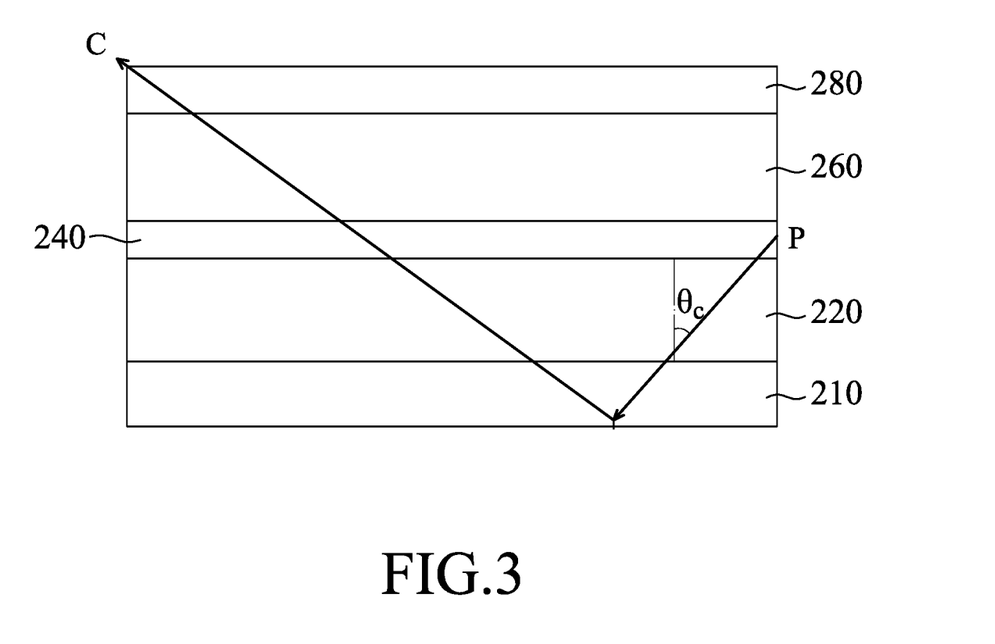
FIG. 3 is a schematic view illustrating a path of light traveling in the first embodiment, in which a substrate, first and second AlGaInP-based waveguide layers, and an $Al_aGa_{(1-a)}In_bP$-based graded layer shown in FIG. 1 are omitted and a DBR structure shown in FIG. 1 is simplified for the sake of brevity.
Figure 4:
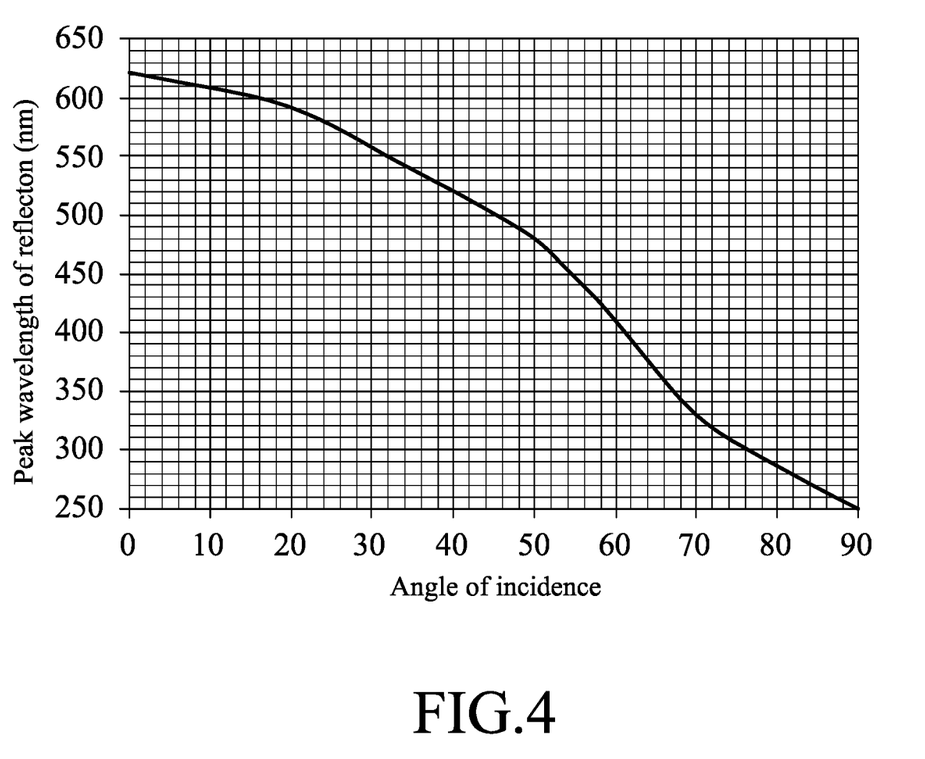
FIG. 4 shows correlation between the angle of incidence and the peak wavelength of reflection.

Specifically, the number "N" is related to the wavelength (λ) of light emitted from the active layer 240 and a critical angle $\theta_c$ leading to emission of light from the first surface (i.e. the light emitting surface) of the light emitting structure. For example, referring to FIG. 3, light emitted from a point (P) on a most distal edge of the active layer 240 is reflected to a point (c) on a most distal edge of the first surface of the light emitting structure. Under such circumstance, the angle of incidence $\theta_c$ is the largest angle of incidence, i.e., $\theta_c$ is the critical angle at which the light emits from the light emitting surface of the light emitting structure. The reflection wavelength corresponding to $\theta_c$ is the maximum wavelength of blue shift (i.e. $\lambda_c$), and incident light having an angle larger than $\theta_c$ will be reflected to be emitted from a lateral surface of the light emitting structure. $\theta_c$ can be calculated via geometrical optics with influence of refraction not taken into consideration. When light emitted from the active layer 240 enters the DBR structure 210 obliquely such that the maximum blue shift is Δλ, Δλ is equal to λ–$\lambda_c$, which leads to equation (II). Further referring to FIG. 4, the correlation between the angle of incidence and the peak wavelength of reflection is shown. The larger the angle of incidence, the shorter the peak wavelength of reflection will become. From the curve shown in FIG. 4, the peak wavelength $\lambda_c$ corresponding to $\theta_c$ can be found, and Δλ can be calculated to further determine the number "N". Therefore, in this embodiment, N may range from 3 to 5.

The materials for respectively making the lower and higher refractive index layers of the first to $N^{th}$ DBR units (DBR 1 to DBR N) may be selected from the following: AlAs/AlGaAs, AlAs/AlGaInP, AlAs/AlInP, AlAs/InGaP, AlGaAs/AlGaInP, AlGaAs/AlInP, AlGaAs/InGaP, AlGaInP/AlInP, AlGaInP/InGaP, and AlInP/InGaP. The lower and higher refractive index layers of the respective one of the first to $N^{th}$ DBR units (DBR 1 to DBR N) may have a ratio difference in aluminum component that is not less than 0.2.

Each of the first to $N^{th}$ DBR units (DBR 1 to DBR N) has a thickness defined by $[\lambda+(z-1)\lambda_0]/4n$ where n is an average refractive index of the first to $N^{th}$ DBR units. For instance, the first DBR unit (DBR 1) has a thickness of λ/4n, the second DBR unit (DBR 2) has a thickness of $(\lambda+\lambda_0)/4n$, and the $N^{th}$ DBR unit (DBR N) has a thickness of $[\lambda+(N-1)\lambda_0]/4n$.

In this embodiment, the materials for respectively making the lower and higher refractive index layers of the first to $N^{th}$ DBR units (DBR 1 to DBR N) are AlAs and AlGaAs. The lower and higher refractive index layers (i.e. the AlAs based layer and the AlGaAs-based layer) of the respective one of the first to $N^{th}$ DBR units (DBR 1 to DBR N) respectively have a thickness of $[\lambda+(z-1)\lambda_0]/4n_1$ and a thickness of $[\lambda+(z-1)\lambda_0]/4n_2$, where $n_1$ represents a refractive index of the AlAs-based layer, and $n_2$ represents a refractive index of the AlGaAs-based layer. For instance, the AlAs-based layer and the AlGaAs-based layer of the first DBR unit (DBR 1) respectively have a thickness of $\lambda/4n_1$ and a thickness of $\lambda/4n_2$, the AlAs-based layer and the AlGaAs-based layer of the second DBR unit (DBR 2) respectively have a thickness of $(\lambda+\lambda_0)/4n_1$ and a thickness of $(\lambda+\lambda_0)/4n_2$, and the AlAs-based layer and the AlGaAs-based layer of $N^{th}$ DBR unit (DBR N) respectively have a thickness of $[\lambda+(N-1)\lambda_0]/4n_1$ and a thickness of $[\lambda+(N-1)\lambda_0]/4n_2$.

When the lower and higher refractive index layers are the AlAs-based layer and the AlGaAs-based layer, respectively, $n_h$ and $n_l$ (i.e. the refractive indices of the higher and lower refractive index layers) are respectively equal to $n_2$ and $n_1$. When λ (i.e. the wavelength of light emitted from the active layer 240) is equal to 620 nm, $\lambda_0$ (i.e. the reference wavelength) is equal to about 46.7 nm.

Figure 5:
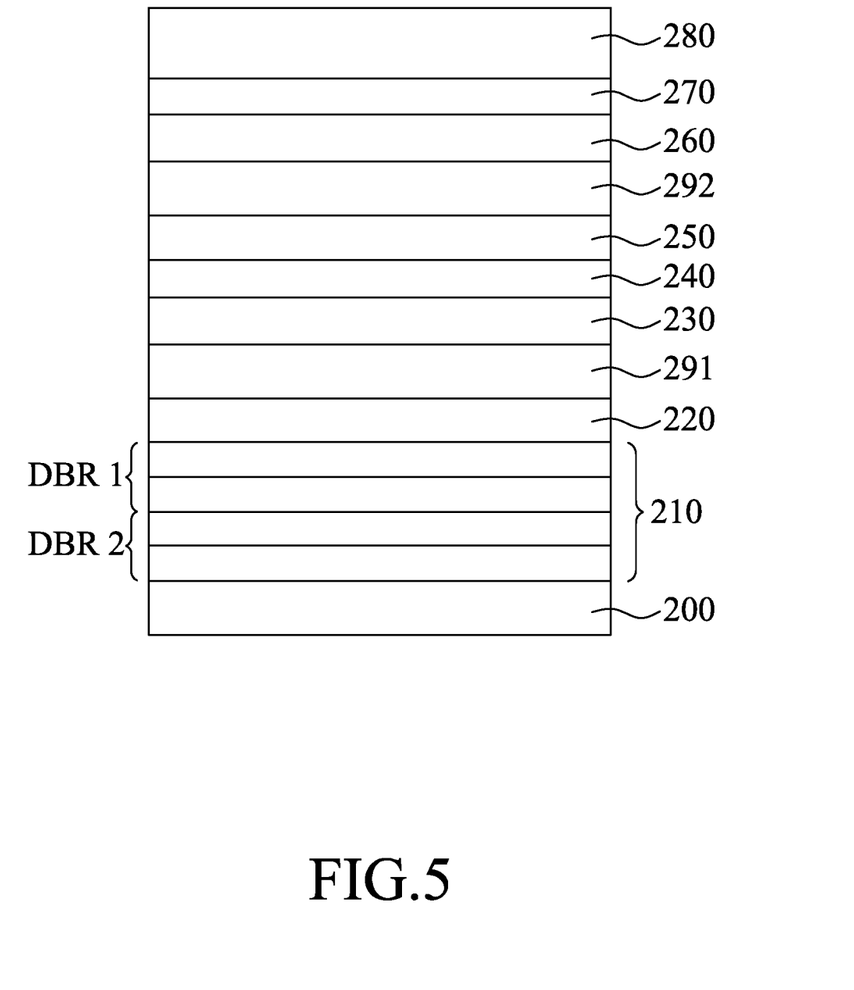
FIG. 5 is a schematic view illustrating a second embodiment of the light emitting device according to the present disclosure.

Referring to FIG. 5, a second embodiment of the light emitting device according to the present disclosure is generally similar to the first embodiment, except for the following differences.

In the second embodiment, the DBR structure 210 has two DBR units, i.e. the first and second DBR units. In other words, the number "N" is 2.

Furthermore, in the second embodiment, the light emitting structure further includes a first $Al_yGa_{(1-y)}InP$-based graded waveguide layer 291 that is disposed between the n-type confinement layer 220 and the first $Al_xGa_{(1-x)}InP$-based waveguide layer 230, and a second $Al_yGa_{(1-y)}InP$-based graded waveguide layer 292 that is disposed between the p-type confinement layer 260 and the second $Al_xGa_{(1-x)}InP$-based waveguide layer 250. "y" gradually changes from x to 1.

The first and second $Al_yGa_{(1-y)}InP$-based graded waveguide layers 291, 292 each have a gradient refractive index so as to reduce lateral traveling of oblique incident light and enhance light output from the light emitting surface (i.e. the first surface) of the light emitting structure.

The first and second $Al_yGa_{(1-y)}InP$-based graded waveguide layers 291, 292 may each have a thickness ranging from 1 nm to 100 nm. The active layer 240 may have a light emission wavelength of 620 nm, such that the first and second $Al_xGa_{(1-x)}InP$-based waveguide layers 230, 250 may be made from $Al_{0.7}Ga_{0.3}InP$, and such that "y" regarding the first and second $Al_yGa_{(1-y)}InP$-based graded waveguide layers 291, 292 may gradually change from 0.7 to 1.

Figure 6:
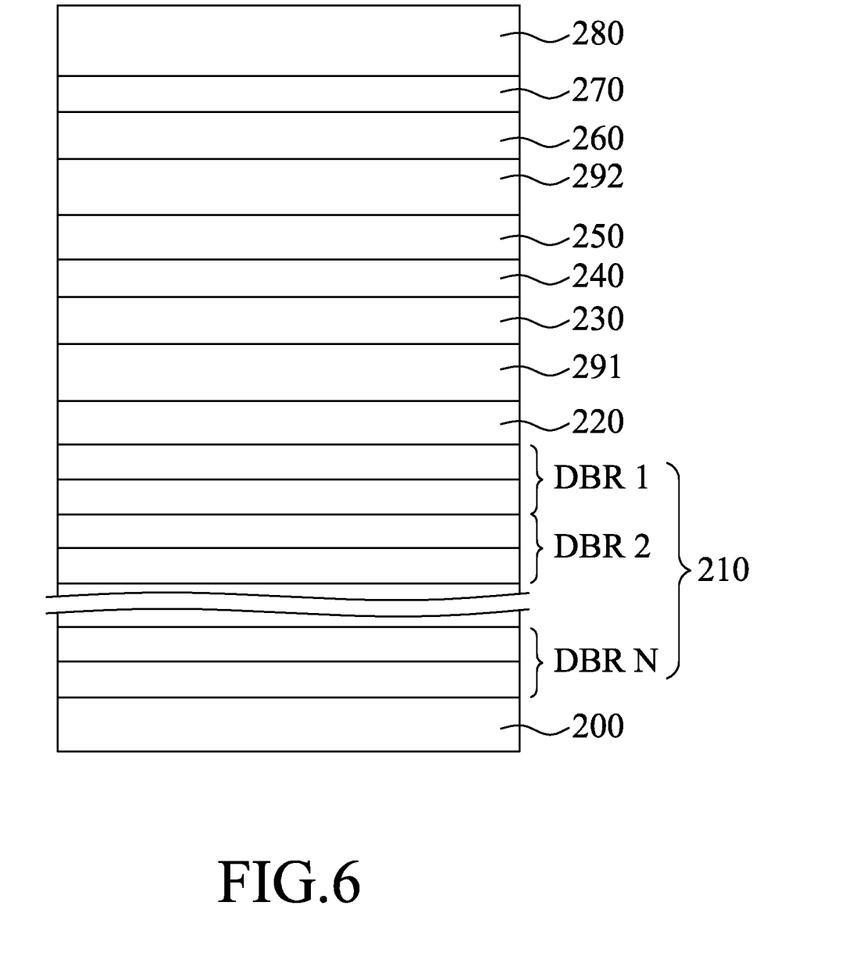
FIG. 6 is a schematic view illustrating a third embodiment of the light emitting device according to the present disclosure.

Referring to FIG. 6, a third embodiment of the light emitting device according to the present disclosure is generally similar to the second embodiment, except that the DBR structure 210 of the third embodiment is the same as that of the first embodiment and hence has the first to $N^{th}$ DBR units (DBR 1 to DBR N).

In the third embodiment (as well as in the first and second embodiments), the efficiency of light emission from the light emitting surface of the light emitting structure can be enhanced by 5% to 15%.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A light emitting device comprising:
a multilayered light emitting structure including an n-type confinement layer, an active layer that is disposed on said n-type confinement layer, and a p-type confinement layer that is disposed on said active layer opposite to said n-type confinement layer; and
a multilayered distributed Bragg reflector (DBR) structure, said light emitting structure being disposed on said DBR structure so that said n-type confinement layer and said p-type confinement layer of said light emitting structure being disposed proximal and distal to said DBR structure, respectively, said DBR structure including first to $N^{th}$ DBR units, N being an integer not less than two, said first to $N^{th}$ DBR units being sequentially arranged in a direction away from said light emitting structure so that said first DBR unit and said $N^{th}$ DBR unit being disposed proximal and distal to said light emitting structure, respectively, each of said first to $N^{th}$ DBR units having a center reflection wavelength defined by $\lambda+(z-1)\lambda_0$, where $\lambda$ represents a wavelength of light emitted from said active layer, z represents a numerical order of a corresponding one of said first to $N^{th}$ DBR units and is not less than 1 and not greater than N, $(z-1)\lambda_0$ represents a maximum blue shift of said corresponding one of said first to $N^{th}$ DBR units, and $\lambda_0$ represents a reference wavelength;
wherein each of said first to $N^{th}$ DBR units has a higher refractive index layer and a lower refractive index layer that are disposed proximal and distal to said light emitting structure, respectively, $\lambda_0$ being defined by equation (I):

$$\lambda_0 = \frac{4\lambda\pi}{\pi^2 \sin^{-1}\left(\frac{n_h - n_l}{n_h + n_l}\right) - 4\sin\left(\frac{n_h - n_l}{n_h + n_l}\right)} \quad (I)$$

where $n_h$ and $n_l$ respectively represent refractive indices of said higher and lower refractive index layers of said corresponding one of said first to $N^{th}$ DBR units at $\lambda$.

2. The light emitting device as claimed in claim 1, wherein N is an integer equal to or greater than 3.

3. A light emitting device comprising:
a multilayered light emitting structure including an n-type confinement layer, an active layer that is disposed on said n-type confinement layer, and a p-type confinement layer that is disposed on said active layer opposite to said n-type confinement layer; and
a multilayered distributed Bragg reflector (DBR) structure, said light emitting structure being disposed on said DBR structure so that said n-type confinement layer and said p-type confinement layer of said light emitting structure being disposed proximal and distal to said DBR structure, respectively, said DBR structure including first to $N^{th}$ DBR units, N being an integer not less than two, said first to $N^{th}$ DBR units being sequentially arranged in a direction away from said light emitting structure so that said first DBR unit and said $N^{th}$ DBR unit being disposed proximal and distal to said light emitting structure, respectively, each of said first to $N^{th}$ DBR units having a center reflection wavelength defined by $\lambda+(z-1)\lambda_0$, where $\lambda$ represents a wavelength of light emitted from said active layer, z represents a numerical order of a corresponding one of said first to $N^{th}$ DBR units and is not less than 1 and not greater than N, $(z-1)\lambda_0$ represents a maximum blue shift of said corresponding one of said first to $N^{th}$ DBR units, and $\lambda_0$ represents a reference wavelength;
wherein N is an integer obtained by rounding off a quotient defined by equation (II):

$$Q = \left[\frac{(\lambda - \lambda_c)}{\lambda_0} + 1\right] \quad (II)$$

where Q represents the quotient and $\lambda_c$ represents a maximum wavelength of light entering said corresponding one of said first to $N^{th}$ DBR units and undergoing a blue shift.

4. The light emitting device as claimed in claim 1, wherein each of said first to $N^{th}$ DBR units has a thickness defined by $[\lambda+(z-1)\lambda_0]/4n$ where n is an average refractive index of said first to $N^{th}$ DBR units.

5. The light emitting device as claimed in claim 1, wherein said light emitting structure further includes an $Al_xGa_{(1-x)}InP$-based waveguide layer that is disposed between said n-type confinement layer and said active layer.

6. The light emitting device as claimed in claim 1, wherein said light emitting structure further includes an $Al_xGa_{(1-x)}InP$-based waveguide layer that is disposed between said p-type confinement layer and said active layer.

7. The light emitting device as claimed in claim 1, wherein said light emitting structure further includes an $Al_yGa_{(1-y)}InP$-based graded waveguide layer and an $Al_xGa_{(1-x)}InP$-based waveguide layer, x being greater than 0 and less than 1, y gradually changing from x to 1, said $Al_yGa_{(1-y)}InP$-based graded waveguide layer and said $Al_xGa_{(1-x)}InP$-based waveguide layer being disposed between said n-type confinement layer and said active layer, and being respectively disposed proximal and distal to said n-type confinement layer.

8. The light emitting device as claimed in claim 1, wherein said light emitting structure further includes an $Al_yGa_{(1-y)}InP$-based graded waveguide layer and an $Al_xGa_{(1-x)}InP$-based waveguide layer, x being greater than 0 and less than 1, y gradually changing from x to 1, said $Al_yGa_{(1-y)}InP$-based graded waveguide layer and said $Al_xGa_{(1-x)}InP$-based waveguide layer being disposed between said p-type confinement layer and said active layer, and being respectively disposed proximal and distal to said p-type confinement layer.

9. The light emitting device as claimed in claim 7, wherein said $Al_yGa_{(1-y)}InP$-based graded waveguide layer has a thickness ranging from 1 nm to 100 nm.

10. The light emitting device as claimed in claim 8, wherein said $Al_yGa_{(1-y)}InP$-based graded waveguide layer has a thickness ranging from 1 nm to 100 nm.

11. The light emitting device as claimed in claim 1, wherein said light emitting structure further includes an $Al_aGa_{(1-a)}In_bP$-based graded layer that is disposed on said p-type confinement layer opposite to said active layer, and a GaP-based window layer that is disposed on said $Al_aGa_{(1-a)}In_bP$-based graded layer opposite to said p-type confinement layer, a being greater than 0 and less than 1, b being greater than 0 and less than 1.

12. The light emitting device as claimed in claim 11, wherein a is not less than 0.1 and less than 1, b ranging from 0.2 to 0.5.

13. The light emitting device as claimed in claim 11, wherein said $Al_aGa_{(1-a)}In_bP$-based graded layer has a thickness ranging from 10 nm to 50 nm.

\* \* \* \* \*